US012765230B2

(12) United States Patent
He et al.

(10) Patent No.: US 12,765,230 B2
(45) Date of Patent: Oct. 13, 2026

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qing He, Beijing (CN); Zhiliang Jiang, Beijing (CN); Zaiyong Long, Beijing (CN); Min Chen, Beijing (CN); Ge Wang, Beijing (CN); Xiaomin Yuan, Beijing (CN); Qingqing Yan, Beijing (CN); Xiangnan Pan, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 455 days.

(21) Appl. No.: 18/283,460

(22) PCT Filed: Jan. 18, 2023

(86) PCT No.: PCT/CN2023/072919
§ 371 (c)(1),
(2) Date: Sep. 22, 2023

(87) PCT Pub. No.: WO2023/143311
PCT Pub. Date: Aug. 3, 2023

(65) Prior Publication Data

US 2024/0180000 A1 May 30, 2024

(30) Foreign Application Priority Data

Jan. 28, 2022 (CN) ........................ 202210108262.4

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
CPC ........................ H10K 59/873; H10K 2102/311
See application file for complete search history.

(56) References Cited

U.S. PATENT DOCUMENTS

2021/0210721 A1* 7/2021 Xue ........................ H10K 71/00
2021/0343981 A1 11/2021 Xie et al.

FOREIGN PATENT DOCUMENTS

CN 109671867 A 4/2019
CN 113937236 A 1/2022
CN 114430014 A 5/2022

OTHER PUBLICATIONS

International Search Report for PCT/CN2023/072919 Mailed Apr. 25, 2023.

* cited by examiner

*Primary Examiner* — Anne M Hines

(57) ABSTRACT

The display substrate comprises: a display area and a peripheral area located on the periphery of the display area, and a blocking dam and at least one blocking column are provided in the peripheral area. The display substrate comprises a base substrate, and a light-emitting structure layer and an encapsulation structure layer provided above the base substrate, the encapsulation structure layer is located on the side of the light-emitting structure layer away from the base substrate, the light-emitting structure layer comprises a cathode, and the encapsulation structure layer comprises an organic encapsulation layer. The at least one blocking column is located between the cathode and the blocking dam, (Continued)

and the orthographic projection of the at least one blocking column on the base substrate is located within the range of the orthographic projection of the organic encapsulation layer on the base substrate.

19 Claims, 3 Drawing Sheets

DISPLAY SUBSTRATE AND DISPLAY DEVICE

CROSS-REFERENCE TO RELATED APPLICATIONS

The present application is a U.S. National Phase Entry of International PCT Application No. PCT/CN2023/072919 having an international filing date of Jan. 18, 2023, which claims priority to Chinese Patent Application No. 202210108262.4 filed on Jan. 28, 2022 and entitled "Display Substrate and Preparation Method therefor, and Display Apparatus". The above-identified applications are incorporated by reference herein in their entireties.

TECHNICAL FIELD

Embodiments of the present disclosure relate to the field of display technologies, and particularly to a display substrate and a display apparatus.

BACKGROUND

Flexible OLED (Organic light emitting Diode) display has advantages of foldability, bendability and narrow frame, which is regarded to have a wide application prospect. OLED displays usually adopt a three-layer Thin Film Encapsulation (TFE) structure of inorganic layer-organic layer-inorganic layer. In TFE encapsulation layer, it is often required that the organic layer material has good fluidity and planarization surface after curing to ensure the encapsulation effect and display effect of the display. However, good fluidity easily leads to overflow of organic materials, and since the weak water and oxygen resistance of organic materials, once overflow occurs, it will lead to the encapsulation failure and affect the display effect.

SUMMARY

The following is a summary of subject matter described herein in detail. The summary is not intended to limit the protection scope of claims.

Embodiments of the present disclosure provide a display substrate and a display apparatus.

In one aspect, embodiments of the present disclosure provide a display substrate, including an active area and a peripheral area located on the periphery of the active area, wherein a barrier dam and at least one barrier post are provided in the peripheral area. The display substrate includes a base substrate, and a light emitting structure layer and a encapsulation structure layer arranged on the base substrate, wherein the encapsulation structure layer is located on a side of the light emitting structure layer away from the base substrate, the light emitting structure layer includes a cathode, and the encapsulation structure layer includes an organic encapsulation layer. The at least one barrier post is located between the cathode and the barrier dam, and an orthographic projection of the at least one barrier post on the base substrate is located within a range of an orthographic projection of the organic encapsulation layer on the base substrate.

In some exemplary implementations, the peripheral area includes four sub-areas, upper, lower, left and right, and the at least one barrier post is arranged in at least one of the sub-areas.

In some exemplary embodiments, the barrier posts are provided in two sub-areas arranged opposite to each other.

In some exemplary embodiments, the at least one barrier post forms at least one annular structure around the active area.

In some exemplary embodiments, the peripheral area is provided with a plurality of barrier posts, which are sequentially arranged along a direction away from the active area.

In some exemplary embodiments, a cross section of the at least one barrier post is arranged in a shape of an inverted trapezoid.

In some exemplary embodiments, the quantity of the barrier posts is less than or equal to 10.

In some exemplary embodiments, the at least one barrier post includes a plurality of sub-barrier posts with spacings between adjacent sub-barrier posts, and the plurality of sub-barrier posts surround the active area.

In some exemplary embodiments, the peripheral area includes a first barrier post, a second barrier post, and a third barrier post arranged sequentially along a direction away from the active area, wherein sub-barrier posts of the first barrier post are aligned with sub-barrier posts of the third barrier post along the direction away from the active area, and spacings between the sub-barrier posts of the first barrier post are aligned with sub-barrier posts of the second barrier post.

In some exemplary embodiments, at least one of the plurality of sub-barrier posts includes a main body portion and a protrusion portion extending from a side of the main body portion towards the active area.

In some exemplary embodiments, the at least one barrier post includes a fourth barrier post and a fifth barrier post arranged sequentially along a direction away from the active area, wherein protrusion portions of sub-barrier posts of the fifth barrier post face spacings between the sub-barrier posts of the fourth barrier post.

In some exemplary embodiments, a furthest distance between a surface of a side of the at least one barrier post close to the active area and a surface of a side of the barrier post away from the active area is set to be from 1 micron to 7 microns; and a distance between a surface of the at least one barrier post away from the base substrate and a surface close to the base substrate is set to be from 0.5 microns to 5 microns.

In some exemplary embodiments, the display substrate further includes a pixel planarization layer located on a side of the light emitting structure layer close to the base substrate, and an orthographic projection of the at least one barrier post on the base substrate is partially overlapped with an orthographic projection of the pixel planarization layer on the base substrate.

On the other hand, an embodiment of the present disclosure provides a preparation method of a display substrate, including: forming a light emitting structure layer on a base substrate of an active area, forming a barrier dam and at least one barrier post on a base substrate of a peripheral area, and forming an encapsulation structure layer. Among them, the light emitting structure layer includes a cathode, and the at least one barrier post is located between the cathode and the barrier dam. An orthographic projection of the at least one barrier post on the base substrate is within the range of an orthographic projection of an organic encapsulation layer of the encapsulation structure layer on the base substrate.

In another aspect, an embodiment of the present disclosure provides a display apparatus, which includes the above display substrate.

In another aspect, an embodiment of the present disclosure provides a display substrate, including a base substrate, an encapsulation structure layer, a barrier dam, and at least one barrier post. The base substrate includes an active area and a peripheral area located on a periphery of the active area. The encapsulation structure layer is arranged on the base substrate, located in the active area and the peripheral area, and includes an organic encapsulation layer. A barrier dam and at least one barrier post are located in the peripheral area, and the at least one barrier post is located on a side of the barrier dam close to the active area. The organic encapsulation layer has a gradient area in the peripheral area, and an orthographic projection of the gradient area of the organic encapsulation layer on the base substrate is overlapped with an orthographic projection of the at least one barrier post on the base substrate.

In some exemplary implementations, an orthographic projection of the organic encapsulation layer on the base substrate is not overlapped with an orthographic projection of the barrier dam on the base substrate.

In some exemplary implementations, the above display substrate may further include a light emitting structure layer located on the base substrate, and the light emitting structure layer is located on a side of the encapsulation structure layer close to the base substrate. The light emitting structure layer includes a cathode layer, and an orthographic projection of the cathode layer on the base substrate is not overlapped with an orthographic projection of the at least one barrier post on the base substrate.

In some exemplary implementations, the at least one barrier post includes a plurality of sub-barrier posts, and there are spacings between adjacent sub-barrier posts.

In some exemplary embodiments, the peripheral area at least includes two adjacent barrier posts arranged sequentially along a direction away from the active area; and spacings between adjacent sub-barrier posts of one of the two barrier posts close to the active area are aligned with sub-barrier posts of one of the two barrier posts away from the active area.

In some exemplary implementations, at least one sub-barrier post of the at least one barrier post includes a main body portion and a protrusion portion extending from a side of the main body portion towards the active area. Protrusion portions of the sub-barrier posts of the barrier post away from the active area face spacings between adjacent sub-barrier posts of the barrier post close to the active area.

In some exemplary implementations, the peripheral area includes four sub-areas, upper, lower, left and right, and the at least one barrier post is arranged in at least one of the sub-areas.

In some exemplary embodiments, the barrier posts are provided in two sub-areas arranged opposite to each other.

Other aspects may be understood upon reading and understanding accompanying drawings and detailed description.

BRIEF DESCRIPTION OF DRAWINGS

The drawings are intended to provide a further understanding for the technical solutions of the present disclosure and form a part of the specification, and are used to explain the technical solutions of the present disclosure together with embodiments of the present disclosure, and do not form limitations on the technical solutions of the present disclosure. Shapes and sizes of one or more components in the drawings do not reflect actual scales, and are only intended to schematically describe contents of the present disclosure.

DESCRIPTION OF REFERENCE SIGNS IN THE DRAWING

Figure 1:
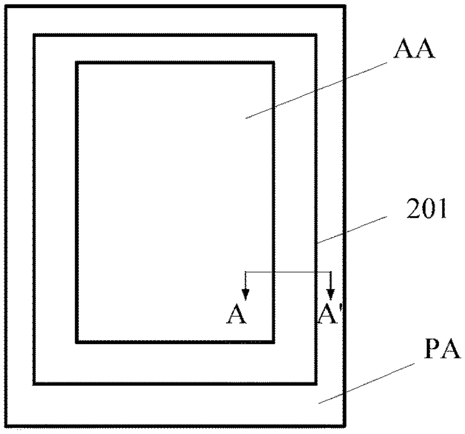
FIG. 1 is a schematic top view of a structure of a display substrate.

101—Base Substrate; 102—Drive Structure Layer; 103—Pixel Planarization Layer;
201—Barrier Dam; 3—Light emitting Structure Layer; 301—Anode;
302—Light emitting Layer; 303—Cathode; 304—Pixel Definition Layer;
305—Connection Electrode; 306—Low—Voltage Line; 401—First Inorganic Encapsulation Layer;
402—Organic Encapsulation Layer; 403—Second Inorganic Encapsulation Layer; 5—Barrier Post;
501—First Barrier Post; 502—Second Barrier Post; 503—Third Barrier Post;
504—First Barrier Post; 505—Second Barrier Post; 506—Third Barrier Post;
507—Fourth Barrier Post; 508—Fifth Barrier Post.

DETAILED DESCRIPTION

The embodiments of the present disclosure will be described in detail below with reference to the drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation.

Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms “mount”, “mutually connect”, and “connect” should be understood in a broad sense. For example, a connection may be a fixed connection, a detachable connection, or an integrated connection; it may be a mechanical connection or an electrical connection; it may be a direct mutual connection, or an indirect connection through middleware, or internal communication between two elements. Those of ordinary skills in the art may understand meanings of the above-mentioned terms in the present disclosure according to situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In a case that transistors with opposite polarities are used, in a case that a direction of a current is changed during operation of a circuit, or the like, functions of the “source electrode” and the “drain electrode” are sometimes interchangeable. Therefore, the “source electrode” and the “drain electrode” are interchangeable in the specification.

In the specification, an “electrical connection” includes a case that constituent elements are connected together through an element having some electrical function. The “element having some electrical function” is not particularly limited as long as electrical signals between the connected constituent elements may be transmitted. Examples of the “element with the certain electrical effect” not only include electrodes and wirings, but also include switch elements such as transistors, resistors, inductors, capacitors, other elements with various functions, etc.

In the specification, “parallel” refers to a state in which an angle formed by two straight lines is above −10° and below 10°, and thus also includes a state in which the angle is above −5° and below 5°. In addition, “perpendicular” refers to a state in which an angle formed by two straight lines is above 80° and below 100°, and thus also includes a state in which the angle is above 85° and below 95°.

In the specification, a “film” and a “layer” are interchangeable. For example, a “conductive layer” may be replaced with a “conductive film” sometimes. Similarly, an “insulation film” may be replaced with an “insulation layer” sometimes.

Figure 2:
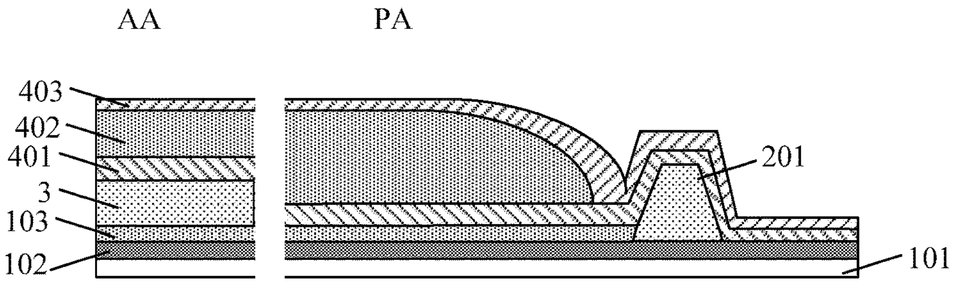
FIG. 2 is a partial sectional view taken along an A-A' direction in FIG. 1.

FIG. 1 is a schematic top view of a structure of a display substrate, and FIG. 2 is a partial sectional view taken along an A-A' direction in FIG. 1. As shown in FIG. 1 and FIG. 2, a display substrate may include an active area AA and a peripheral area PA located on least one side of the active area AA, and a barrier dam 201 is provided in the peripheral area PA.

As shown in FIG. 2, the active area AA of the display substrate may include a base substrate 101, and a drive structure layer 102, a pixel planarization layer 103, a light emitting structure layer 3 and an encapsulation structure layer that are arranged sequentially on the base substrate 101. Among them, the drive structure layer 102 is located on the base substrate 101, the pixel planarization layer 103 is located on the drive structure layer 102, and the light emitting structure layer 3 is located on the drive structure layer 102 and is electrically connected with thin film transistor in the drive structure layer 102. The encapsulation structure layer may include a first inorganic encapsulation layer 401, an organic encapsulation layer 402, and a second inorganic encapsulation layer 403 from bottom to top. The peripheral area PA of the display substrate may include a base substrate 101, a drive structure layer 102 arranged on the base substrate 101, a barrier dam 201 arranged on the drive structure layer 102, and a first inorganic encapsulation layer 401 and a second inorganic encapsulation layer 403 covering the barrier dam 201. The barrier dam 201 may be arranged around the active area AA and may block a movement of the organic encapsulation layer 402 towards the peripheral area PA, thereby preventing overflow of the organic encapsulation layer 402. An orthographic projection of the first inorganic encapsulation layer 401 on the base substrate 101 may coincide with an orthographic projection of the second inorganic encapsulation layer 403 on the base substrate 101, and an orthographic projection of the organic encapsulation layer 402 on the base substrate 101 may be located within a range of the orthographic projection of the second inorganic encapsulation layer 403 on the base substrate 101.

However, in the above design in which a barrier dam (dam) is provided in the peripheral area of the display substrate to block the movement of the organic material forming the organic encapsulation layer, the organic layer material is likely to flow to the barrier dam and climb up along the barrier dam, and especially in the display substrate with a narrow bezel, since the distance between the organic encapsulation layer and the barrier dam is short, the climbing movement is more likely to occur. In some technologies, in a case that a thickness of the organic encapsulation layer at the edge of the active area is less than that at the center of the active area (i.e., the thickness of the organic encapsulation layer at the edge of the active area is thinner), when the organic encapsulation layer climbs at the barrier dam, the organic materials filled within the pixel openings at the edge of the active area will be less, and even no organic materials may be filled within some pixel openings, thus affecting the encapsulation performance. In addition, this climbing movement of the organic encapsulation layer also easily leads to gaps or fractures in the encapsulation structure layer, and water vapor in the atmosphere will enter the light emitting devices along the gaps, which will make the organic materials in the light emitting devices oxidized and invalid, and form invalid areas that cannot emit light. As vapor continuously intrudes the light emitting device along the crack, the invalid region gradually expands, resulting in poor display of the display apparatus, which is referred to as Growing Dark Spot (GDS). This climbing movement of organic encapsulation layer may also affect the subsequent processing process, for example, it may affect an exposure process of FMLOC (Flexible Multi-Layer On Cell), resulting in the display substrate failing to pass the reliability test.

An embodiment of the present disclosure proposes a display substrate. The display substrate includes an active area and a peripheral area located on the periphery of the active area, wherein a barrier dam and at least one barrier post are provided in the peripheral area. The display substrate includes a base substrate, and a light emitting structure layer and a encapsulation structure layer arranged on the base substrate, wherein the encapsulation structure layer is located on a side of the light emitting structure layer away from the base substrate, the light emitting structure layer includes a cathode, and the encapsulation structure layer includes an organic encapsulation layer. The at least one barrier post is located between the cathode and the barrier dam, and an orthographic projection of the at least one barrier post on the base substrate is located within a range of an orthographic projection of the organic encapsulation layer on the base substrate. Among them, orthographic projections of the at least one barrier post and the cathode of the light emitting structure layer on the base substrate may be not overlapped.

According to the display substrate of this example, by arranging at least one barrier post between the cathode and the barrier dam, at least one layer of barrier may be formed between the organic encapsulation layer and the barrier dam, which indirectly prolongs a distance between the organic encapsulation layer and the barrier dam, and may prevent the organic encapsulation layer from climbing up at the barrier dam and reduce a risk of overflow of the organic encapsulation layer. Moreover, the display substrate provided by the embodiment of the present disclosure may help to improve the planarization and encapsulation effect of the organic encapsulation layer at the edge of the display substrate, which may avoid the GDS defect caused by the introduction of water and oxygen into the display substrate through the organic encapsulation layer.

In some exemplary embodiments, the quantity of barrier dams in the peripheral area may be one or two, which is not limited by the present disclosure.

In some exemplary embodiments, the barrier dam may be arranged to surround the active area.

In some exemplary embodiments, the encapsulation structure layer may include a first inorganic encapsulation layer, an organic encapsulation layer, and a second inorganic encapsulation layer that are stacked. For example, the first inorganic encapsulation layer and the second inorganic encapsulation layer may cover the active area, the barrier post and the barrier dam; and the organic encapsulation layer may cover the active area and the barrier post, and an orthographic projection of the organic encapsulation layer on the base substrate may not overlapped with an orthographic projection of the barrier dam on the base substrate.

In some exemplary embodiments, the at least one barrier post may form at least one annular structure surrounding the active area. For example, one barrier post may form an annular structure surrounding the active area. In some examples, a shape of the annular structure may be circular, rectangular, and elliptical or in another shape. For example, an orthographic projection of the annular structure on the base substrate may be a continuous closed ring; or the orthographic projection on the base substrate is a discontinuous annular structure, for example, the annular structure may include a plurality of components. There are spacings between the plurality of components, and the plurality of components collectively form an annular shape surrounding the active area.

In some embodiments, as shown in FIG. 1, the peripheral area may include four sub-areas, upper, lower, left and right, and at least one arranged barrier post may be arranged in only one of the sub-areas, or may be arranged in sub-areas on opposite sides, for example, in the left and right sub-areas.

In some exemplary embodiments, the peripheral area may be provided with a plurality of barrier posts, which may be sequentially arranged along a direction away from the active area. For example, each of the plurality of barrier posts may form an annular structure surrounding the active area, thereby forming a multilevel barrier to the organic encapsulation layer in the peripheral area. A size of the annular structure formed by each barrier post may be different, and a plurality of barrier posts are distributed in a plurality of annular shapes between the cathode and the barrier dam. Shapes of the plurality of annular structures formed by the plurality of barrier posts may be the same or at least partially different. For example, the plurality of annular structures formed by the plurality of barrier posts may all be closed rings, or the plurality of annular structures formed by the plurality of barrier posts may all be discontinuous annular structures; or the annular structure formed by at least one of the plurality of barrier posts is a closed ring, and the annular structure formed by at least one barrier post is a discontinuous annular structure. This embodiment is not limited thereto.

In some exemplary embodiments, a cross section of the at least one barrier post may be arranged in a shape of an inverted trapezoid. For example, the barrier post may be arranged around the active area, and a cross section of the barrier post is perpendicular to a plane in which the active area lies. A tangential plane of the barrier post in a direction away from the active area and perpendicular to its own extending direction (or a tangential direction of a point on the barrier post) and perpendicular to the plane where the active area is located is set as a cross section of the barrier post, and the cross section of the barrier post is arranged to be an inverted trapezoid. The cross section of the barrier post in this example is a plane perpendicular to the plane where the display substrate is located and perpendicular to the direction extension of the barrier post. The cross section of the barrier post is arranged to be an inverted trapezoid in this example, which may be beneficial for a better prevention of the flow of the organic encapsulation layer. In other implementations, the cross section of the barrier post may also be arranged to be in other shapes, such as polygons of other shapes, for example, trapezoids or the like.

In some exemplary embodiments, at least one barrier post is arranged between the active area and the barrier dam, each of which is arranged to be a continuous and closed annular structure, i.e. a closed ring.

In some exemplary embodiments, the quantity of barrier posts may be less than or equal to 10. In some examples, the quantity of barrier posts may be less than or equal to 5, for example, 3. For example, one to five barrier posts with annular structures may be arranged between the cathode and the barrier dam, i.e. one to five levels of barrier may be formed between the active area and the barrier dam. The quantity of barrier posts is not limited in the present embodiment, for example, different quantities of barrier posts may be arranged between the cathode and the barrier dam according to actual needs.

In some exemplary embodiments, a furthest distance between a surface of a side of the barrier post close to the active area and a surface of a side of the barrier post away from the active area may be set to be from 1 micron to 7 microns; and a distance between a surface of the barrier post away from the base substrate and a surface close to the base substrate may be set to be from 0.5 microns to 5 microns. In one example, a furthest distance between a surface of a side of the barrier post close to the active area and a surface of a side of the barrier post away from the active area may be set to be from 2 micron to 5 microns; and a distance between a surface of the barrier post away from the base substrate and a surface close to the base substrate may be set to be from 1 microns to 3 microns. In this example, a width of the barrier post may be set to be the maximum size of the barrier post in a direction from the active area to the peripheral area, i.e. a length of an orthographic projection of the barrier post on the base substrate along a direction from the peripheral area towards the active area is the farthest distance between the surface of a side of the barrier post close to the active area and the surface of a side of the barrier post away from the active area. A height of the barrier post may be set to be a vertical distance between a surface away of the barrier post from the base substrate and a surface of the barrier post close to the base substrate.

In some exemplary embodiments, at least one barrier post may include a plurality of sub-barrier posts, there may be spacings between adjacent sub-barrier posts, and the plurality of sub-barrier posts may surround the active area. For example, the plurality of sub-barrier posts may form discontinuous annular structures surrounding the active area. In this implementations, the orthographic projection of at least one barrier post on the base substrate may not be a closed ring, and the spacings between adjacent sub-barrier posts may form a notch of an annular structure. In some examples, the quantity of sub-barrier posts included by the barrier posts, as well as shapes, sizes, and spacings of the sub-barrier posts, may be set as required, which is not limited in the present disclosure.

In some exemplary embodiments, at least one barrier post of the peripheral area may include a first barrier post, a second barrier post, and a third barrier post arranged sequentially along a direction away from the active area. Along the direction away from the active area, the sub-barrier posts of the first barrier post may be aligned with the sub-barrier posts of the third barrier post, and the spacing between the sub-barrier posts of the first barrier post may be aligned with the sub-barrier posts of the second barrier post.

In some examples, the minimum distance between two cross sections of the sub-barrier post is referred to as a length of the sub-barrier post, i.e. the minimum distance of the surfaces between adjacent spacings which the sub-barrier post faces. In some exemplary implementations, the spacings between the sub-barrier posts of the first barrier post are aligned with the sub-barrier posts of the second barrier post, and the length of the sub-barrier posts of the second barrier post is greater than a length of the spacings between the sub-barrier posts of the first barrier post.

In some examples, the first barrier post, the second barrier post, and the third barrier post may form a first annular structure, a second annular structure, and a third annular structure, respectively, around the active area. Since there are spacings between the sub-barrier posts of each barrier post, orthographic projections of the first ring structure, the second annular structure and the third annular structure on the base substrate are discontinuous or closed rings with spacings, and the discontinuous positions correspond to the spacings between the sub-barrier posts respectively. Along a direction away from the active area, the sub-barrier posts of the first barrier post and the sub-barrier posts of the third barrier post may be aligned, i.e. along a direction away from the active area, discontinuous positions of the orthographic projections of the first annular structure and the third annular structure on the base substrate are corresponding. The spacings between the sub-barrier posts of the first barrier posts may be aligned with the sub-barrier posts of the second barrier posts, and the lengths of the sub-barrier posts of the second barrier posts may be greater than the spacings between the sub-barrier posts of the first barrier posts, i.e., along a direction away from the active area, an orthographic projection of the sub-barrier posts of the second barrier post on the base substrate may correspond to discontinuous positions of the orthographic projections of the first annular structure and the third annular structure on the base substrate. With the cooperation of the first annular structure, the second annular structure and the third annular structure, a complete closure of the active area may be formed, so that there is no vacancy along various directions away from the active area.

In some exemplary embodiments, at least one sub-barrier post of the at least one barrier post may include a main body portion and a protrusion portion extending from a side of the main body portion towards the active area. By arranging the sub-barrier post to include the main body portion and a protruding portion extending from a side of the main body portion towards the active area, a greater blocking effect may be achieved on the flow of the organic encapsulation layer.

In some exemplary embodiments, a width of the main body portion is used to represent a width of the sub-barrier posts, i.e. the farthest distance between surfaces of a side of the main body portions of the sub-barrier posts close to the active area and surfaces of a side of the main body portions of the sub-barrier posts away from the active area may be set to be from 1 micron to 7 microns; a height of the main body portions is used to represent a height of the sub-barrier posts, that is, a distance between the surfaces of the main body portions of the sub-barrier post away from the base substrate and the surfaces close to the base substrate may be set to be from 0.5 microns to 5 microns.

In some exemplary embodiments, the furthest distance between surfaces of a side of the main body portions of the sub-barrier posts close to the active area and surfaces of a side of the main body portions of the sub-barrier posts away from the active area may be set to be from 2 microns to 5 microns, and a distance between surfaces of the main body portions of the sub-barrier post away from the base substrate and surfaces close to the base substrate may be set to be from 1 microns to 3 microns.

In some exemplary embodiments, widths of protrusion portions of the sub-barrier posts, i.e. the farthest distance between surfaces of the protrusion portions of a side of the sub-barrier posts close to the active area and surfaces of a side of the main body portions of the sub-barrier post close to the active area, may be set to be from 1 micron to 7 microns; heights of the protrusion portions of the sub-barrier post, i.e. a distance between surfaces of the protrusion portions of the sub-barrier post away from the base substrate and surfaces close to the base substrate, may be set to be from 0.5 microns to 5 microns; and lengths of the protrusion portions of the sub-barrier posts is the minimum distance between two cross sections of the protrusion portions of the sub-barrier posts. The sizes of the main body portions and the protrusion portions of the sub-barrier posts may be set as required, which is not limited in the present disclosure.

In some exemplary embodiments, the at least one barrier post may include a fourth barrier post and a fifth barrier post arranged sequentially along a direction away from the active area, wherein protrusion portions of a sub-barrier post of the fifth barrier post face spacings between the sub-barrier posts of the fourth barrier post.

In some exemplary implementations, lengths of the sub-barrier posts of the fifth barrier post may be greater than the spacings between the sub-barrier posts of the fourth barrier post. The fourth barrier post and the fifth barrier post may form a fourth annular structure and a fifth annular structure surrounding the active area, respectively, and the protrusion portions of the sub-barrier posts are all directed towards the active area. Along the direction away from the active area, an orthographic projection of the sub-barrier posts of the fifth barrier posts on the base substrate corresponds to discontinuous positions of an orthographic projection of the fourth annular structure on the base substrate. With the cooperation of the fourth annular structure and the fifth annular structure, a complete closure of the active area is formed, and there is no vacancy along a plurality of directions away from the active area. The protruding portions of the sub-barrier posts are directed towards the active area, which may better block the movement of the organic encapsulation layer.

In some exemplary embodiments, the display substrate may further include a pixel planarization layer located on a side of the light emitting structure layer close to the base substrate, and an orthographic projection of the at least one barrier post on the base substrate may be partially overlapped with an orthographic projection of the pixel planarization layer on the base substrate.

In some exemplary implementations, the orthographic projection of the pixel planarization layer on the base substrate may not be overlapped with the orthographic projection of the barrier posts on the base substrate, or the orthographic projection of the pixel planarization layer on the base substrate may contain an orthographic projection of at least one of the plurality of barrier posts close to the active area on the base substrate. In a case that a plurality of barrier posts are provided, the orthographic projection of one or more barrier posts on the base substrate may be set to be within a range of the orthographic projection of the pixel planarization layer on the base substrate.

In some embodiments, the barrier dam may be made of a resin material, may be made of the same material as the pixel planarization layer, and may be formed in the same process as the pixel planarization layer.

Technical contents of the present disclosure will be described below through exemplary embodiments.

Figure 3:
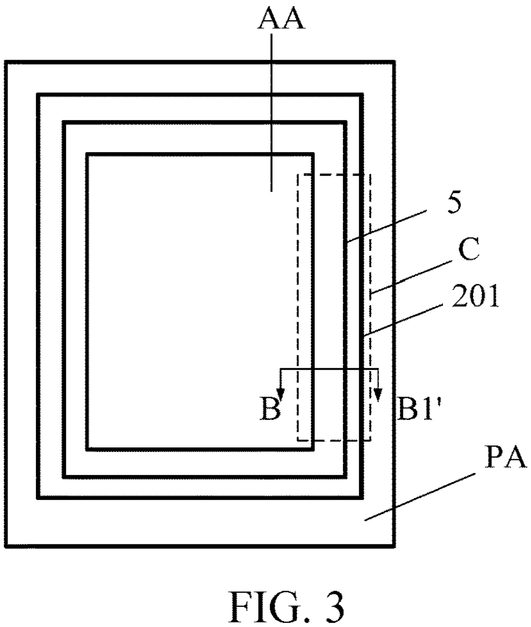
FIG. 3 is a schematic top view of a display substrate according to at least one embodiment of the present disclosure.
Figure 4:
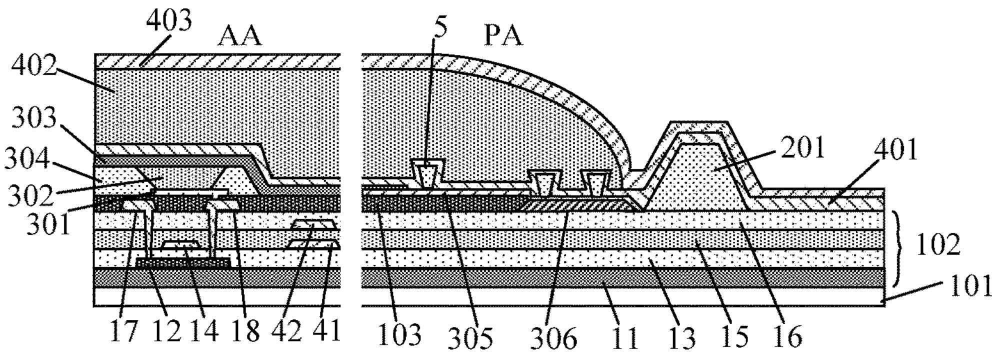
FIG. 4 is a partial sectional view taken along a B-B' direction in FIG. 3.

FIG. 3 is a schematic top view of a display substrate according to at least one embodiment of the present disclosure. FIG. 4 is a partial sectional view taken along a B-B' direction in FIG. 3. In some examples, as shown in FIG. 3, the display substrate of this example may include an active area AA and a peripheral area PA located on a periphery of the active area AA. The peripheral area PA can include four sub-areas, upper, lower, left and right. The peripheral area PA may be provided with a barrier dam 201 and at least one barrier post 5 (one barrier post 5 is illustrated as an example in FIG. 3), wherein the barrier dam 201 may be arranged to surround the active area AA, the at least one barrier post 5 may be arranged between the barrier dam 201 and the active area AA, and at least one barrier post 5 may be arranged to surround the active area AA. For example, the barrier dam 201 and the barrier post 5 may be arranged in each of the four sub-areas, upper, lower, left and right of the peripheral area PA. However, this embodiment is not limited thereto. For example, at least one barrier post may be arranged in two oppositely arranged sub-areas (e.g. left and right sub-areas) of the peripheral area PA.

In some examples, as shown in FIG. 4, in a direction perpendicular to the display substrate, the display substrate of the active area AA may include a base substrate 101, and a drive structure layer 102, a pixel planarization layer 103, a light emitting structure layer, and a encapsulation structure layer which are arranged sequentially on the base substrate 101. The drive structure layer 102 of the active area AA may include a plurality of pixel circuits, and a first insulation layer 11, a second insulation layer 13, a third insulation layer 15, and a fourth insulation layer 16 which are arranged between the pixel circuits. At least one pixel circuit may include a plurality of transistors and at least one storage capacitor. In FIG. 4, it is illustrated by taking one first transistor (e.g. a first transistor) and one capacitor (a first storage capacitor) as an example. As shown in FIG. 4, the first transistor may include an active layer 12, a gate electrode 14, a source electrode 17 and a drain electrode 18, wherein a first insulation layer 11 is provided between the base substrate 101 and the active layer 12, a second insulation layer 13 is provided between the active layer 12 and the gate electrode 14, and a third insulation layer 15 and a fourth insulation layer 16 are provided between the gate electrode 14, and the source electrode 17 and the drain electrode 18. The first storage capacitor may include a first capacitor electrode 41 and a second capacitor electrode 42. The first capacitor electrode 41 is arranged on the second insulation layer 13, and a third insulation layer 15 is provided between the first capacitor electrode 41 and the second capacitor electrode 42. A pixel planarization layer 103 is provided on the drive structure layer 102, and a light emitting structure layer is provided on the pixel planarization layer 103, which may include a plurality of light emitting elements. At least one light emitting element may include an anode, a cathode and a light emitting layer arranged between the anode and the cathode. Cathodes of the plurality of light emitting elements may be of an integral structure. In a direction perpendicular to the base substrate, the light emitting structure layer may include an anode layer (e.g. including an anode 301), a light emitting layer 302, a cathode layer (e.g. a cathode 303) and a pixel definition layer 304. The anode 301 may be connected to a drain electrode of the first transistor through a second via opened in the pixel planarization layer 103, a pixel opening of the pixel definition layer 304 may expose a surface of the anode 301, a light emitting layer 302 is formed within the pixel opening and connected to the anode 301, and a part of the cathodes 303 are connected to the light emitting layer 302. An encapsulation structure layer is provided on the light emitting structure layer, and the encapsulation structure layer may cover the active area AA. The encapsulation structure layer may include a first inorganic layer 401, an organic encapsulation layer 402, and a second inorganic layer 403 which are stacked.

In some examples, as shown in FIG. 4, in a direction perpendicular to the display substrate, the display substrate of the peripheral area PA may include a base substrate 101, and a drive structure layer 102, a pixel planarization layer 103, a connection electrode 305, three barrier posts 5, a barrier dam 201, and a encapsulation structure layer which are arranged on the base substrate 101. The drive structure layer 102 of the peripheral area PA may include a first insulation layer 11, a second insulation layer 13, a third insulation layer 15, and a fourth insulation layer 16 which are stacked on the base substrate 101, and a low-voltage line 306. The low-voltage line 306 may be arranged on the fourth insulation layer 16, and the pixel planarization layer 103 may cover a part of the low-voltage line 306. A connection electrode 305 is provided on the pixel planarization layer 103, and the connection electrode 305 may be connected to the low-voltage line 306. A cathode layer of the light emitting structure layer may extend from the active area AA to the peripheral area PA, and is connected to the connection electrode 305 in the peripheral area PA, and the cathode layer may be electrically connected to the low-voltage line 306 through the connection electrode 305. A barrier dam 201 is also provided on the drive structure layer 102, and three barrier posts 5 may be provided between an edge of the cathode layer and the barrier dam 201, and the three barrier posts 5 may be arranged sequentially along a direction away from the active area AA. In this example, the orthographic projection of a barrier post 51 closest to the active area AA on the base substrate 101 may be overlapped with an orthographic projection of the pixel planarization layer 103 on the base substrate 101, which may be located, for example, within a range of an orthographic projection of the pixel planarization layer 103 on the base substrate 101. The orthographic projections of the remaining two barrier posts 5 on the base substrate 101 may not be overlapped with an orthographic projection of the pixel planarization layer 103 on the base substrate 101.

In some examples, as shown in FIG. 4, an orthographic projection of the first inorganic encapsulation layer 401 on the base substrate 101 may coincide with an orthographic projection of the second inorganic encapsulation layer 403 on the base substrate 101, and an orthographic projection of the organic encapsulation layer 402 on the base substrate 101 may be located within a range of the orthographic projection of the second inorganic encapsulation layer 403 on the base substrate 101. In the peripheral area PA, the orthographic projections of the first inorganic encapsulation layer 401 and the second inorganic encapsulation layer 403 of the encapsulation structure layer on the base substrate 101 may cover an orthographic projection of the barrier dam 201 on the base substrate 101. The orthographic projection of the organic encapsulation layer 402 on the base substrate 101 is not overlapped with the orthographic projection of the barrier dam 201 on the base substrate 101, and the barrier dam 201 may be located on a side of the organic encapsulation layer 402 away from the active area AA. The orthographic projection of the organic encapsulation layer 402 on the base substrate 101 may cover the orthographic projections of the three barrier posts 5 on the base substrate 101.

In some examples, as shown in FIG. 4, a cross section of at least one of the barrier posts 5 may be arranged in a shape of an inverted trapezoid. In other examples, the cross section of the barrier post 5 may be of other shapes, for example, the shape of the cross section of the barrier post 5 may be of a shape having a length away from the edge of the base substrate greater than the length close to an edge of the base substrate. For example, an orthographic projection of the surface of the barrier post 5 close to the base substrate may fall within a range of an orthographic projection range of the surface of the barrier post 5 away from the base substrate. In other examples, the cross section of the barrier posts 5 may be arranged in a shape of a trapezoid, for example, an orthographic projection of a surface of the barrier posts 5 away from the base substrate may fall within a range of an orthographic projection of a surface of the barrier posts 5 close to the base substrate.

Figure 5:
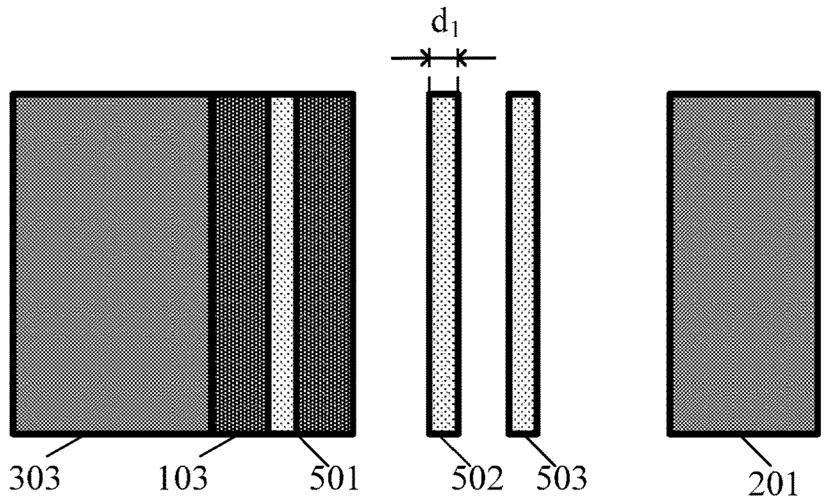
FIG. 5 is a schematic view of one position of the barrier post within the region C in FIG. 3.

FIG. 5 is a schematic view of the position of the barrier post within the region C in FIG. 3. FIG. 5 is a schematic view of a region C in FIG. 3. The positions of the cathode 303, the pixel planarization layer 103, the barrier dam 201 and the three barrier posts 5 within the region C are illustrated in FIG. 5, and the rest of the structures are omitted. As shown in FIG. 5, three barrier posts 5 may be provided between the cathode 303 and the barrier dam 201. For example, the three barrier posts 5 may include a first barrier post 501, a second barrier post 502, and a third barrier post 503 arranged sequentially along a direction away from the active area AA, each of which is arranged as a continuous closed ring around the active area AA. For example, the sizes of the three closed annular structures formed by the three barrier posts may gradually increase along a direction away from the active area.

In some examples, the widths of the three barrier posts may be approximately the same, and the width of each barrier post may be set to be d1. For example, the width d1 of a single barrier post may be about 2 microns to 5 microns. An orthographic projection of the first barrier post 501 on the base substrate 101 may be within a range of an orthographic projection of the pixel planarization layer 103 on the base substrate 101. The quantity of the barrier posts is not limited in the present embodiment, which may be, for example, set as required.

In some examples, as shown in FIG. 4 and FIG. 5, the edge of the cathode layer may be located on a side of the first barrier post 501 close to the active area. The edge of the pixel planarization layer 103 may be located between the first barrier post 501 and the second barrier post 502. An orthographic projection of the cathode layer on the base substrate may not be overlapped with orthographic projections of the three barrier posts on the base substrate. A spacing between the first barrier post 501 and the second barrier post 502 may be greater than a spacing between the second barrier post 502 and the third barrier post 503. The spacing between the first barrier post 501 and the second barrier post 502 may be approximately the same as a spacing between the third barrier post 503 and the barrier dam 201. This embodiment is not limited thereto.

In some examples, as shown in FIG. 4 and FIG. 5, the organic encapsulation layer 402 may include a planarization area and a gradient area located on a periphery of the planarization area. The gradient area may be located on least in the peripheral area. An orthographic projection of the planarization area of the organic encapsulation layer 402 on the base substrate may be overlapped with the active area, for example, the planarization area of the organic encapsulation layer 402 may cover the active area. An orthographic projection of the gradient area of the organic encapsulation layer 402 on the base substrate may be overlapped with an orthographic projection of at least one barrier post on the base substrate. For example, the orthographic projection of the gradient area of the organic encapsulation layer 402 on the base substrate may be overlapped with the orthographic projections of the second barrier post 502 and the third barrier post 503 on the base substrate, and the orthographic projection of the planarization area of the organic encapsulation layer 402 on the base substrate may be overlapped with an orthographic projection of the first barrier post 501 on the base substrate. In other examples, the orthographic projection of the gradient area of the organic encapsulation layer on the base substrate may be overlapped with the orthographic projections of one or three barrier posts on the base substrate.

Figure 6:
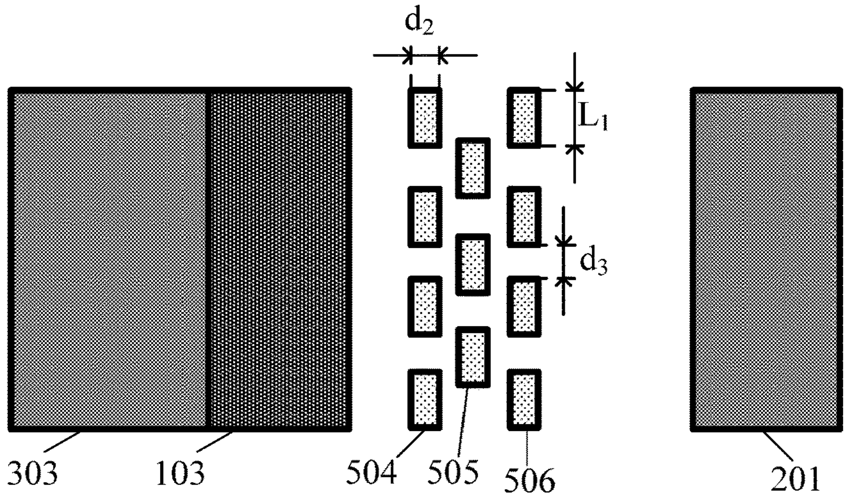
FIG. 6 is a schematic view of another position of the barrier post within the region C in FIG. 3.

FIG. 6 is a schematic view of another position of the barrier post within the region C in FIG. 3. FIG. 6 is a schematic view of a region C in FIG. 3. The positions of the cathode 303, the pixel planarization layer 103, the barrier dam 201 and the three barrier posts 5 are illustrated in FIG. 6, and the rest of the structures are omitted. In some examples, as shown in FIG. 4 and FIG. 6, three barrier posts 5 may be provided between the cathode layer and the barrier dam 201. The three barrier posts 5 may include a first barrier post 504, a second barrier post 505, and a third barrier post 506 which are arranged sequentially along a direction away from the active area AA. Spacings between adjacent barrier posts in the three barrier posts may be approximately the same. An orthographic projection of the three barrier posts on the base substrate may not be overlapped with an orthographic projection of the pixel planarization layer 103 on the base substrate. The three barrier posts may be located on a side of the edge of the pixel planarization layer 103 close to the barrier dam 201.

In some examples, as shown in FIG. 6, each barrier post may include a plurality of sub-barrier posts with a same size. For example, orthographic projections of the sub-barrier posts on the base substrate may be rectangles with lengths $L_1$ and widths $d_2$, there is a space with a size $d_3$ between adjacent sub-barrier posts of each barrier post, and a plurality of sub-barrier posts are arranged around the active area AA. In other examples, sizes of sub-barrier posts of different barrier posts may be different. For example, the lengths of the sub-barrier posts of the first barrier post 504 may be greater than the lengths of the sub-barrier posts of the second barrier post 505, and the lengths of the sub-barrier posts of the second barrier post 505 may be greater than the lengths of the sub-barrier posts of the third barrier post 506. For another example, the lengths of the sub-barrier posts of the second barrier posts 505 may be greater than the lengths of the sub-barrier posts of the first barrier posts 504, and may also be greater than the lengths of the sub-barrier posts of the third barrier posts 506. For another example, the widths of the sub-barrier posts of the second barrier posts 505 may be greater than the widths of the sub-barrier posts of the first barrier posts 504, and may also be greater than the widths of the sub-barrier posts of the third barrier posts 506. For another example, the widths of the sub-barrier posts of the first barrier post 504 may be greater than the widths of the sub-barrier posts of the second barrier post 505, and the widths of the sub-barrier posts of the second barrier post 505 may be greater than the widths of the sub-barrier posts of the third barrier post 506.

In some examples, as shown in FIG. 6, along a direction away from the active area AA, the sub-barrier posts of the first barrier post 504 may be aligned with the sub-barrier posts of the third barrier post 506, the spacings between the sub-barrier posts of the first barrier post 504 may be aligned with the sub-barrier posts of the second barrier posts 505, and the lengths $L_1$ of the sub-barrier posts of the second barrier post 505 are greater than the spacings $d_3$ between the sub-barrier posts of the first barrier posts 504. The first barrier post 504, the second barrier post 505, and the third barrier post 506 form a first annular structure, a second annular structure, and a third annular structure with notches that are spaced areas between the sub-barrier posts, respectively. Along the direction away from the active area AA, the notches of the first annular structure and the third annular structure may be aligned, and there may be misalignments between the notch of the second annular structure, and the notches of the first and third annular structures. The first annular structure, the second annular structure, and the third annular structure may together form a closed ring, and the notches of the remaining barrier posts may be filled with the sub-barrier posts of at least one barrier post. With the cooperation of the first annular structure, the second annular structure and the third annular structure, a complete closed ring around the active area AA may be formed to achieve surrounding the active area AA omnidirectionally. According to actual needs, the barrier posts may include any quantity of sub-barrier posts. Shapes and sizes of the sub-barrier posts, and shapes and sizes of spacings between adjacent sub-barrier posts may be set according to needs, and sub-barrier posts contained by different barrier posts may be different, which is not limited in the embodiments of the present disclosure.

Figure 7:
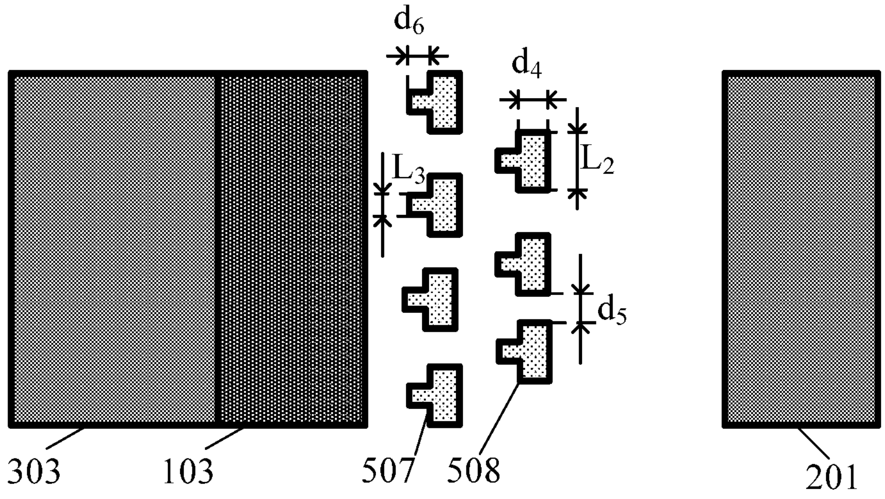
FIG. 7 is a schematic view of another position of the barrier post within the region C in FIG. 3.

FIG. 7 is a schematic view of another position of the barrier post within the region C in FIG. 3. FIG. 7 is a schematic view of a region C in FIG. 3. The positions of the cathode 303, the pixel planarization layer 103, the barrier dam 201 and the three barrier posts 5 are illustrated in FIG. 7, and the rest of the structures are omitted. In some examples, as shown in FIG. 7, two barrier posts may be provided between the cathode layer and the barrier dam 201, and the two barrier posts may include a fourth barrier post 507 and a fifth barrier post 508 arranged sequentially along a direction away from the active area AA. Orthographic projections of the two barrier posts on the base substrate may not be overlapped with an orthographic projection of the pixel planarization layer 103 on the base substrate, and the orthographic projections of the two barrier posts on the base substrate may be located on a side of the edge of the pixel planarization layer 103 close to the barrier dam 201. Each barrier post includes a plurality of sub-barrier posts with the same size, and at least one sub-barrier post may include a main body portion and a protrusion portion extending from the main body portion towards the active area AA. For example, a length of the main body portion is $L_2$ and a width is $d_4$, and a width of the protrusion portion is $d_6$ and a length is $L_3$. There may be a spacing between adjacent sub-barrier posts of each barrier post, the size of the spacing may be $d_5$, and a plurality of sub-barrier posts may be provided around the active area AA. In some examples, the length of the body portion of at least one sub-barrier post may be greater than the length of the protrusion portion, and the width of the body portion of the sub-barrier post may be greater than the width of the protrusion portion. In other examples, the sizes of a plurality of sub-barrier posts of different barrier posts may be different. For example, the lengths of the main body portions of the sub-barrier posts of the fourth barrier post 507 may be greater than the lengths of the main body portions of the sub-barrier posts of the fifth barrier post 508, and the widths of the protrusion portions of the sub-barrier posts of the fourth barrier post 507 may be greater than the lengths of the protrusion portions of the sub-barrier posts of the fifth barrier post 508. For another example, the lengths of the main body portions of the sub-barrier posts of the fourth barrier post 507 may be approximately the same as those of the main body portions of the sub-barrier posts of the fifth barrier post 508, and the lengths of the protrusion portions of the sub-barrier posts of the fourth barrier post 507 may be larger than the protrusion portions of the sub-barrier posts of the fifth barrier post 508.

In some examples, as shown in FIG. 7, the fourth barrier posts 507 and the fifth barrier posts 508 may form a fourth annular structure and a fifth annular structure with notches, respectively, and the notches of the annular structures are the spaced areas between the main body portions of the sub-barrier posts of the barrier posts. Along the direction away from the active area AA, the notches of the fourth annular structure and the fifth annular structure may be misaligned, the protrusion portions of the sub-barrier posts of the fifth barrier post 508 may face the spacings between the sub-barrier posts of the fourth barrier post 507, and the sub-barrier posts forming the fifth annular structure may fill the notches between the sub-barrier posts forming the fourth annular structure. With the cooperation of the fourth annular structure and the fifth annular structure, a complete closed ring around the active area AA may be formed to achieve surrounding the active area AA omnidirectionally.

In some other implementations, the barrier posts described in FIG. 5-FIG. 7 may be combined with each other. For example, on the basis of the structures shown in FIG. 5, the second barrier post 502 is replaced by the second barrier post 506 in FIG. 6; or, on the basis of the structures shown in FIG. 6, the second barrier post 506 is replaced by the fourth barrier post 507 in FIG. 7. The present disclosure is not limited thereto.

A structure of the display substrate according to the present disclosure will be described below through an example of a preparation process of the display substrate. A "patterning process" mentioned in the present disclosure includes processes such as deposition of a film layer, photoresist coating, mask exposure, development, etching, and photoresist stripping. The deposition may be any one or more of sputtering, evaporation, and chemical vapor deposition, the coating may be any one or more of spray coating and spin coating, and the etching may be any one or more of dry etching and wet etching. A "thin film" refers to a layer of a thin film prepared from a material on an underlay substrate using a process of deposition or coating. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern". "A and B are arranged in a same layer" mentioned in the present disclosure means that A and B are simultaneously formed through a same patterning process. "An orthographic projection of A includes an orthographic projection of B" means that the orthographic projection of B falls within a range of the orthographic projection of A, or the orthographic projection of A covers the orthographic projection of B.

Hereinafter, a manufacturing process of a display substrate is described with reference to FIG. 4 with some examples. The preparation process of the display substrate of the example may include following steps.

(1) A base substrate 101 is prepared. In some examples, the base substrate 101 may be a flexible underlay substrate. For example, the base substrate 101 may include a first flexible material layer, a first inorganic material layer, a semiconductor layer, a second flexible material layer and a second inorganic material layer which are stacked on a glass carrier plate. The first flexible material layer and the second flexible material layer may be made of polyimide (PI), polyethylene terephthalate (PET) or surface-treated polymer soft film, etc; the first inorganic material layer and the second inorganic material layer may be made of silicon nitride (SiNx) or silicon oxide (SiOx), etc. to improve water and oxygen resistance of the base substrate, and the first inorganic material layer and the second inorganic material layer are also called barrier layers; and the semiconductor layer may be made of amorphous silicon (a-si). After this process, both the active area AA and the peripheral area PA include the base substrate 101.

(2) A drive structure layer 102 is prepared on the base substrate 101. In some exemplary implementations, the drive structure layer of the active area AA may include a pixel drive circuit, which may include, for example, a plurality of transistors and at least one capacitor. The drive structure layer of the peripheral area PA may include a composite insulation layer composed of a plurality of inorganic insulation layers.

In some exemplary implementations, a manufacturing process of the drive structure layer may include following acts.

A first insulation thin film and an active layer thin film are sequentially deposited on the base substrate 101 and the active layer thin film is patterned by a patterning process to form a first insulation layer 11 covering the entire base substrate 101 and a pattern of an active layer arranged on the first insulation layer 11, and the active layer 12 may be formed in the active area AA. After this patterning process, the peripheral area PA may include the first insulation layer 11 arranged on the base substrate 101.

Then, a second insulation thin film and a first metal thin film are sequentially deposited and the first metal thin film is patterned through a patterning process to form the second insulation layer 13 covering the pattern of the active layer and a pattern of a first gate metal layer arranged on the second insulation layer 13, the pattern of the first gate metal layer may be formed in the active area AA and may include a gate electrode 14, a first capacitor electrode 41, a plurality of gate lines (not shown), and a plurality of gate leads (not shown). After this patterning process, the peripheral area PA may include the first insulation layer 11 and the second insulation layer 13 that are stacked on the base substrate 101.

Then, a third insulation thin film and a second metal thin film are sequentially deposited and the second metal thin film is patterned through a patterning process to form the third insulation layer 15 covering the first gate metal layer and a pattern of a second gate metal layer arranged on the third insulation layer 15, the pattern of the second gate metal layer is formed in the active area AA and may include a second capacitor electrode 42 and a second gate lead (not shown), a position of the second capacitor electrode 42 corresponds to a position of the first capacitor electrode 41. After this patterning process, the peripheral area PA may include the first insulation layer 11, the second insulation layer 13, and the third insulation layer 15 that are stacked on the base substrate 101.

Then, a fourth insulation thin film is deposited, the fourth insulation thin film is patterned by a patterning process to form a pattern of a fourth insulation layer 16 covering the second gate metal layer, wherein the fourth insulation layer 16 is provided with two first vias which are formed in the active area AA. Positions of the two first vias correspond to positions of two ends of the first active layer 12. The fourth insulation layer 16, the third insulation layer 15 and the second insulation layer 13 within the two first vias are etched away to expose parts of surfaces of the active layer 12. After this patterning process, the peripheral area PA includes the first insulation layer 11, the second insulation layer 13, the third insulation layer 15, and the fourth insulation layer 16 that are stacked on the base substrate 101.

Subsequently, a third metal thin film is deposited, the third metal film is patterned by a patterning process, and a pattern of a source-drain metal layer is formed on the fourth insulation layer 16. The source-drain metal layer of the active area AA may include a source electrode 17, a drain electrode 18, and a plurality of data lines (not shown), and the source electrode 17 and the drain electrode 18 are connected to the active layer 12 through the first via, respectively. After this patterning process, the peripheral area PA includes the first insulation layer 11, the second insulation layer 13, the third insulation layer 15 and the fourth insulation layer 16 which are stacked on the flexible underlay substrate 10, and a low-voltage line 306 arranged on the fourth insulation layer 16. In some exemplary implementations, the source-drain metal layer may further include any one or more of a power supply line (VDD), a compensation line, and an auxiliary cathode according to actual needs. The source-drain metal layer is also called a first source-drain metal layer (SD1).

So far, manufacturing of the pattern of the drive structure layer on the flexible underlay substrate 10 is achieved. The active layer 12, the gate electrode 14, the source electrode 17 and the drain electrode 18 may form a first transistor, and the first capacitor electrode 41 and the second capacitor electrode 42 may form a first storage capacitor. In an exemplary implementation mode, the first transistor may be a Thin Film Transistor (TFT).

(3) A first planarization thin film is coated on the base substrate forming the aforementioned pattern to form a pixel planarization layer 103, and a second via, a first partition and a second partition are formed in the pixel planarization layer 103 by a patterning process, wherein the second via is formed in the active area AA, which may expose a part of the surface of the drain electrode of the first transistor, and the first partition and the second partition are formed in the peripheral area PA. The pixel planarization layer 103 within the first partition is removed by development, which may expose the surface of the low-voltage line 306, and the pixel planarization layer 103 within the second partition is removed by development to expose the surface of the fourth insulation layer 16. The pixel planarization layer 103 between the first partition and the second partition may be referred to as a first dam foundation, which is a component of the barrier dam 201. In the present disclosure, when the second partition is formed in the peripheral area PA for subsequent encapsulations, the inorganic layer in the encapsulation layer directly contacts the fourth insulation layer 16, thus ensuring the packaging effect and process quality.

(4) A transparent conductive thin film is deposited on the base substrate on which the aforementioned pattern is formed, and the transparent conductive film is patterned by a patterning process to form a pattern of an anode layer. The anode layer may include patterns of an anode 301 and a connection electrode 305, wherein the anode 301 is formed on the pixel planarization layer 103 of the active area AA and is connected to a drain electrode of the first transistor through the second via on the pixel planarization layer 103, and the connection electrode 305 is formed in the peripheral area PA and is connected to the low-voltage line 306.

(5) A pixel definition thin film is coated on the base substrate on which the aforementioned pattern is formed, and patterns of a pixel definition layer 304, and a second dam foundation are formed through masking, exposure and development processes, wherein the pixel definition layer 304 is formed in the active area AA and is provided thereon with a pixel opening, and the pixel definition thin film within the pixel opening is developed away to expose a surface of the anode 301. A second dam foundation is formed in the peripheral area PA and is located over the first dam foundation, and the second dam foundation is a component of the barrier dam 201.

(6) A light emitting layer 302 and a cathode layer (e.g. including cathode 303) are formed sequentially on the base substrate on which the aforementioned pattern is formed. In some examples, the light emitting layer 302 may include a hole injection layer, a hole transport layer, an organic light emitting layer, an electron transport layer, and an electron injection layer that are stacked, and the light emitting layer 302 may be formed within the pixel opening of the active area AA and is connected to the anode 301. Since the anode 301 is connected to the drain electrode of the transistor, the light emitting control of the light emitting layer 302 is achieved. One portion of the cathode 303 is connected to the light emitting layer, and after the other portion of the cathode 303 covers the pixel definition layer 304, it extends to the peripheral area PA and is connected to the connection electrode 305 in the peripheral area PA. Since the connection electrode 305 is connected to the low-voltage line 306, it is achieved that the cathode 303 is connected to the low-voltage line 306.

(7) A barrier post thin film is coated on the base substrate on which the aforementioned pattern is formed, and patterns of at least one barrier post 5 and a third dam foundation are formed in the peripheral area PA through masking, exposure and development processes. For example, a plurality of barrier posts 5 may be located between the barrier dam 201 and the cathode 303, and a cross section of at least one of the barrier posts 5 may be in a shape of an inverted trapezoid. The third dam foundation may be located above the second dam foundation and is a component of the barrier dam 201. For example, the first dam foundation, the second dam foundation, and the third dam foundation are stacked sequentially to form a barrier dam 201, which may have a trapezoidal cross-sectional shape. As described above, when both the barrier post thin film and the pixel definition layer are made of polyimide, they may be formed in the same layer by the same preparation process.

(8) an encapsulation structure layer is formed on the base substrate on which the aforementioned pattern is formed. In some examples, the encapsulation structure layer is formed in the active area AA and the peripheral area PA, which may adopt a stacked structure of inorganic material/organic material/inorganic material. Two inorganic material layers (i.e., the first inorganic encapsulation layer 401 and the second inorganic encapsulation layer 403) may be arranged in the active area AA and the peripheral area PA to wrap the barrier post 5 and the barrier dam 201, and the organic material layer (i.e., the organic encapsulation layer 402) is arranged between the two inorganic material layers, and is located on a side of the barrier dam 201 away from the peripheral area PA to cover the barrier post 5.

In some examples, the materials of the first inorganic encapsulation layer 401 and the second inorganic encapsulation layer 403 may include materials having a water and oxygen blocking effect, for example, silicon nitride, silicon oxide, silicon carbide (SiC), aluminum oxide (Al2O3), ZnS, ZnO and the like. The first inorganic encapsulation layer 401 and the second inorganic encapsulation layer 402 may be formed by means of chemical vapor deposition (CVD), atomic layer deposition (ALD) and other deposition modes. The material of the organic encapsulation layer 402 may be a mixture of a Monomer organic main body (more than 95% in volume) and a photoinitiator, a reactive diluent, various additives and the like, and can be formed into a film by ink jet printing and solidified under ultraviolet light irradiation to form the organic encapsulation layer 402.

(9) The glass carrier plate is stripped to form the display substrate according to an embodiment of the present disclosure, as shown in FIG. 4.

In other implementations, the barrier dams may be prepared by other means, and two barrier dams may be provided in the peripheral area as required, and the quantity of barrier dams and the preparation method are not limited in the disclosed embodiment. In other implementations, a source-drain metal layer (double SD) structure with two layers may be adopt, which is not limited in the present disclosure.

In this example, the first insulation thin film, the second insulation thin film, the third insulation thin film and the fourth insulation thin film may be made of any one or more of silicon oxide (SiOx), silicon nitride (SiNx) and silicon oxynitride (SiON), and may be a single layer, a plurality of layers, or a composite layer. The first insulation layer may be referred to as a buffer layer, which is used to improve the water and oxygen resistance capability of the underlay substrate. The second insulation layer and the third insulation layer may be referred to as gate insulation (GI) layers. The fourth insulation layer may be referred to as an interlayer insulation (ILD) layer. The first metal thin film, the second metal thin film, and the third metal thin film may be made of a metal material, such as any one or more of silver (Ag), copper (Cu), aluminum (Al) and molybdenum (Mo), or an alloy material of the above metals, such as AlNd alloy or MoNb alloy, which may have a single-layer structure or a multi-layer composite structure, such as Mo/Cu/Mo. The pixel planarization layer 15 may be made of an organic material. The cathode may be made of any one or more of Magnesium (Mg), Argentum (Ag), Aluminum (Al), Copper (Cu), and Lithium (Li), or an alloy made of any one or more of the aforementioned metals. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene and other materials, that is, the present disclosure is applicable to transistors manufactured based on an oxide technology, a silicon technology, and an organic matter technology. The transparent conductive thin film may be made of indium tin oxide (ITO) or indium zinc oxide (IZO). The pixel definition layer may be made of polyimide, acrylic or polyethylene terephthalate, and the barrier post thin film may be made of polyimide, polysilane, acrylic or epoxy resin.

In some embodiments, both the barrier post thin film and the pixel definition layer are made of polyimide, including the same material.

The structure of the display substrate of an embodiment of the present disclosure and the manufacturing process thereof are described only as an example. In some examples, a corresponding structure may be changed and a patterning process may be increased or decreased according to actual needs.

An embodiment of the present disclosure further provides a preparation method for a display substrate. The preparation method includes following acts. A light emitting structure layer is formed on the base substrate of the active area, and a barrier dam and at least one barrier post are formed on the base substrate of a peripheral area, respectively, wherein the light emitting structure layer includes a cathode, and the at least one barrier post is located between the cathode and the barrier dam; an encapsulation structure layer is formed on the display substrate on which the above-mentioned structure is formed, and an orthographic projection of the at least one barrier post on the base substrate is within a range of an orthographic projection of an organic encapsulation layer of the encapsulation structure layer on the base substrate.

In this example, at least one barrier post is arranged between the cathode and the barrier dam, so that at least one layer of barrier is formed between the organic encapsulation layer and the barrier dam, which indirectly prolongs a distance between the organic encapsulation layer and the barrier dam, and may prevent the organic encapsulation layer from climbing up at the barrier dam and reduce a risk of overflow of the organic encapsulation layer. Moreover, the preparation method of the display substrate provided by an embodiment of the present disclosure may help to improve the planarization and encapsulation effect of the organic encapsulation layer at the edge of the display substrate, which may avoid the GDS defect caused by the introduction of water and oxygen through the organic encapsulation layer.

The embodiment also provides a display substrate, including a base substrate, an encapsulation structure layer, a barrier dam, and at least one barrier post. The base substrate includes an active area and a peripheral area located on a periphery of the active area. The encapsulation structure layer is arranged on the base substrate, located in the active area and the peripheral area, and includes an organic encapsulation layer. The barrier dam and the at least one barrier post are located in the peripheral area, and the at least one barrier post is located on a side of the barrier dam close to the active area. The organic encapsulation layer has a gradient area in the peripheral area, and an orthographic projection of the gradient area of the organic encapsulation layer on the base substrate is overlapped with an orthographic projection of the at least one barrier post on the base substrate.

The display substrate provided by the embodiment may form at least one level of barrier on a side of the organic encapsulation layer close to the barrier dam by forming at least one barrier post overlapping with the gradient area of the organic encapsulation layer, so that the organic encapsulation layer from climbing up to the barrier dam during the preparation process may be effectively prevented, the overflow risk of the organic encapsulation layer may be reduced, and may also help to improve the planarization and encapsulation effect of the organic encapsulation layer, which may prevent water and oxygen from passing into the display substrate through the organic encapsulation layer to form GDS defects.

In some exemplary implementations, an orthographic projection of the organic encapsulation layer on the base substrate is not overlapped with an orthographic projection of the barrier dam on the base substrate.

In some exemplary implementations, the above display substrate may further include a light emitting structure layer located on the base substrate, and the light emitting structure layer is located on a side of the encapsulation structure layer close to the base substrate. The light emitting structure layer includes a cathode layer, and an orthographic projection of the cathode layer on the base substrate is not overlapped with an orthographic projection of the at least one barrier post on the base substrate.

In some exemplary implementations, the at least one barrier post includes a plurality of sub-barrier posts with spacings between adjacent sub-barrier posts. For example, when the barrier post includes a plurality of disconnected sub-barrier posts, the barrier post may form a discontinuous annular structure around the active area.

In some exemplary implementations, the peripheral area at least includes two adjacent barrier posts arranged sequentially along the direction away from the active area. Spacings between adjacent sub-barrier posts of one of the two barrier posts close to the active area is aligned with sub-barrier posts of one of the two barrier posts away from the active area. For example, in FIG. 6, the sub-barrier posts of the second barrier post 505 may be aligned with the spacings between adjacent sub-barrier posts of the first barrier post 504, and the sub-barrier posts of the third barrier post 506 may be aligned with the spacings between adjacent sub-barrier posts of the second barrier post 506.

In some exemplary implementations, at least one sub-barrier post of the at least one barrier post includes a main body portion and a protrusion portion extending from a side of the main body portion towards the active area. Protrusion portions of the sub-barrier posts of the barrier post away from the active area face spacings between adjacent sub-barrier posts of the barrier post close to the active area. For example, in FIG. 7, the projection portions of the sub-barrier posts of the fifth barrier post 508 may face spacings between adjacent sub-barrier posts of the fourth barrier post 507.

In some exemplary implementations, the at least one barrier post is a closed annular structure surrounding the active area. For example, in FIG. 5, the first barrier post 502 and the second barrier post 503 may both be closed annular structures surrounding the active area.

In some exemplary implementations, the peripheral area may include four sub-areas of the upper, lower, left and right, and the at least one barrier post may be arranged in at least one of the sub-areas. In some examples, barrier posts may be provided in two sub-areas arranged opposite to each other. For example, barrier posts may be arranged in the left and right sub-areas.

Relevant description of the display substrate of the present embodiment may refer to the descriptions in the aforementioned embodiments, and thus will not be repeated here.

The embodiment further provides a display apparatus which includes the display substrate using the aforementioned embodiments. In some examples, the display apparatus may be any product or component with a display function, such as a mobile phone, a tablet computer, a television, a display, a laptop computer, a digital photo frame, and a navigator.

Although the implementations disclosed in the present disclosure are as above, the described contents are only implementations used for convenience of understanding the present disclosure and are not intended to limit the present disclosure. Any skilled person in the art to which the present invention pertains can make any modifications and alterations in forms and details of implementations without departing from the spirit and scope of the present disclosure. However, the patent protection scope of the present disclosure should be subject to the scope defined by the appended claims.

The invention claimed is:

1. A display substrate, comprising an active area and a peripheral area located on a periphery of the active area, wherein a barrier dam and at least one barrier post are arranged in the peripheral area;

the display substrate comprises a base substrate, and a light emitting structure layer and an encapsulation structure layer arranged on the base substrate, wherein the encapsulation structure layer is located on a side of the light emitting structure layer away from the base substrate, the light emitting structure layer comprises a cathode, and the encapsulation structure layer comprises an organic encapsulation layer; and the at least one barrier post is located between the cathode and the barrier dam, and an orthographic projection of the at least one barrier post on the base substrate is located within a range of an orthographic projection of the organic encapsulation layer on the base substrate, wherein the display substrate further comprises a pixel planarization layer, wherein the pixel planarization layer is located on a side of the light emitting structure layer close to the base substrate, and an orthographic projection of the at least one barrier post on the base substrate is partially overlapped with an orthographic projection of the pixel planarization layer on the base substrate.

2. The display substrate according to claim 1, wherein the peripheral area comprises four sub-areas of upper, lower, left and right, and the at least one barrier post is arranged in at least one of the sub-areas.

3. The display substrate according to claim 2, wherein barrier posts are provided in two sub-areas arranged opposite to each other.

4. The display substrate according to claim 1, wherein the peripheral area is provided with a plurality of barrier posts, which are arranged sequentially along a direction away from the active area.

5. The display substrate according to claim 1, wherein a quantity of barrier posts is less than or equal to 10.

6. The display substrate according to claim 1, wherein the at least one barrier post comprises a plurality of sub-barrier posts, there are spacings between adjacent sub-barrier posts, and the plurality of sub-barrier posts surround the active area.

7. The display substrate according to claim 6, wherein the peripheral area comprises a first barrier post, a second barrier post, and a third barrier post arranged sequentially along a direction away from the active area, wherein sub-barrier posts of the first barrier post are aligned with sub-barrier posts of the third barrier post along the direction away from the active area, and spacings between the sub-barrier posts of the first barrier post are aligned with sub-barrier posts of the second barrier post.

8. The display substrate according to claim 6, wherein at least one of the plurality of sub-barrier posts comprises a main body portion and a protrusion portion extending from a side of the main body portion towards the active area.

9. The display substrate according to claim 8, wherein the at least one barrier post comprises a fourth barrier post and a fifth barrier post arranged sequentially along a direction away from the active area, wherein protrusion portions of sub-barrier posts of the fifth barrier post face spacings between sub-barrier posts of the fourth barrier post.

10. The display substrate according to claim 1, wherein a cross section of the at least one barrier post is arranged in a shape of a trapezoid.

11. A display apparatus, comprising a display substrate according to claim 1.

12. A display substrate, comprising:

a base substrate, comprising an active area and a peripheral area located on a periphery of the active area;

an encapsulation structure layer, arranged on the base substrate, located in the active area and the peripheral area, and comprising an organic encapsulation layer;

a barrier dam and at least one barrier post, located in the peripheral area, wherein the at least one barrier post is located on a side of the barrier dam close to the active area; and the organic encapsulation layer has a gradient area in the peripheral area, and an orthographic projection of the gradient area of the organic encapsulation layer on the base substrate is overlapped with an orthographic projection of the at least one barrier post on the base substrate, wherein the display substrate further comprises a light emitting structure layer located on the base substrate, wherein the light emitting structure layer is located on a side of the encapsulation structure layer close to the base substrate and comprises a cathode layer, wherein the display substrate further comprises a pixel planarization layer, wherein the pixel planarization layer is located on a side of the light emitting structure layer close to the base substrate, and an orthographic projection of the at least one barrier post on the base substrate is partially overlapped with an orthographic projection of the pixel planarization layer on the base substrate.

13. The display substrate according to claim 12, wherein an orthographic projection of the organic encapsulation layer on the base substrate is not overlapped with an orthographic projection of the barrier dam on the base substrate.

14. The display substrate according to claim 12, wherein an orthographic projection of the cathode layer on the base substrate is not overlapped with an orthographic projection of the at least one barrier post on the base substrate.

15. The display substrate according to claim 12, wherein the at least one barrier post comprises a plurality of sub-barrier posts, and there are spacings between adjacent sub-barrier posts.

16. The display substrate according to claim 15, wherein the peripheral area at least comprises: two adjacent barrier posts arranged sequentially along a direction away from the active area; and spacings between adjacent sub-barrier posts of one of the two barrier posts close to the active area are aligned with sub-barrier posts of one of the two barrier posts away from the active area.

17. The display substrate according to claim 16, wherein at least one sub-barrier post of the at least one barrier post comprises a main body portion and a protrusion portion extending from a side of the main body portion towards the active area; and protrusion portions of the sub-barrier posts of the barrier post away from the active area face the spacings between adjacent sub-barrier posts of the barrier post close to the active area.

18. The display substrate according to claim 12, wherein the peripheral area comprises four sub-areas of upper, lower, left and right, and the at least one barrier post is arranged in at least one of the sub-areas.

19. The display substrate according to claim 18, wherein barrier posts are provided in two sub-areas arranged opposite to each other.

* * * * *